United States Patent [19]
Gieseke et al.

[11] Patent Number: 5,023,480
[45] Date of Patent: Jun. 11, 1991

[54] PUSH-PULL CASCODE LOGIC

[75] Inventors: Bruce A. Gieseke, Natick; Robert A. Conrad, Millbury; James J. Montanaro, Princeton; Daniel W. Dobberpuhl, Shrewsbury, all of Mass.

[73] Assignee: Digital Equipment Corporation, Maynard, Mass.

[21] Appl. No.: 460,818

[22] Filed: Jan. 4, 1990

[51] Int. Cl.$^5$ .................... H03K 5/153; H03F 3/45
[52] U.S. Cl. ................................. 307/448; 307/451; 307/279; 307/530; 307/362; 307/481
[58] Field of Search ............. 307/443, 448, 451, 475, 307/279, 530, 48–481, 296.4, 362

[56] References Cited

U.S. PATENT DOCUMENTS

| | | | |
|---|---|---|---|
| 4,631,424 | 12/1986 | Miyagi | 307/448 |
| 4,695,744 | 9/1987 | Giordano | 307/279 |
| 4,739,198 | 4/1988 | Maruyama | 307/530 |
| 4,816,706 | 3/1989 | Dhong et al. | 307/279 |
| 4,833,347 | 5/1989 | Rabe | 307/443 |
| 4,864,159 | 9/1989 | Cornelissen | 307/279 |
| 4,929,853 | 5/1990 | Kim et al. | 307/279 |

OTHER PUBLICATIONS

Heller et al, "Cascode Voltage Switch Logic: A Differential CMOS Logic Family", ISSCC 84, Feb. 24, 1984, pp. 16–17.

Primary Examiner—Stanley D. Miller
Assistant Examiner—M. Wambach
Attorney, Agent, or Firm—Arnold, White & Durkee

[57] ABSTRACT

A cascode logic circuit provides a pair of differential output nodes that are pulled up by a pair of cross-coupled P-channel output transistors. The output nodes are connected to outputs of an N-channel combinatorial network that receives a differential input and functions to connect one of the output nodes to a positive supply and the other to ground, depending upon the differential input, thus providing a push-pull effect. The output nodes may be connected to the differential output of the combinatorial network by source-drain paths of separate N-channel transistors, with the gates of these transistors connected to the positive supply to capacitively isolate the output nodes from the combinatorial network; alternatively, the gates of these transistors may be clocked. A fully static latch is provided by adding cross-coupled N-channel transistors connecting the output nodes to ground, so the low side of the output is held down instead of being allowed to float. The channel types of the transistors may be reversed in another embodiment; the pull-down transistors of the differential amplifier may be N-channel and the logic and latching transistors P-channel.

18 Claims, 2 Drawing Sheets

PUSH-PULL CASCODE LOGIC

BACKGROUND OF THE INVENTION

This invention relates to logic circuits, and more particularly to cascode logic circuits of the type used in integrated circuit devices.

Cascode voltage switch logic circuits are described by Heller et al in ISSCC84, Feb. 2, 1984, p. 16, or by Robert L. Rabe in U.S. Pat. No. 4,833,347, issued May 23, 1989 for "Charge Distribution Resistant Logic Circuits Utilizing True and Complement Input Control Circuits. These are differential CMOS logic arrangements providing the features of no direct current after the latch sets, and low capacitive loading of the inputs. This type of logic reduces the number of devices needed, and thus reduces circuit delays. However, it is found that performance is limited by the set time of the latch. In particular, in a conventional cascode voltage switch logic circuit the voltage one of the output nodes must drop, turning on the pullup on the opposite leg of the differential amplifier, before the voltage on the other output node (and the associated part of the input combinatorial network) may transition high. Second, in the conventional cascode voltage switch logic circuit, all of the positive charge must be supplied by the differential amplifier transistors (the two-up transistors, P-channel in the usual case).

A feature of the present invention is providing a circuit consistent with conventional CMOS logic and processes, that can be used where performance issues are paramount. Particularly, features of high speed and low power dissipation are of importance in the circuit of this invention. Additionally, reducing device count and therefore reducing area in an integrated circuit are objectives.

SUMMARY OF THE INVENTION

In accordance with one embodiment of the invention, a cascode logic circuit is provided which has a pair of differential output nodes that are pulled up by a pair of cross-coupled P-channel output transistors. The output nodes are connected to outputs of an N-channel combinatorial network that receives a differential input and functions to connect one of the output nodes to a positive supply and the other to ground, depending upon the differential input, thus providing a push-pull effect. The output nodes may be connected to the differential output of the combinatorial network by source-drain paths of separate N-channel transistors, with the gates of these transistors connected to the positive supply to capacitively isolate the output nodes from the combinatorial network; alternatively, the gates of these transistors may be clocked to provide a dynamic latching function. A fully static latch is provided by adding cross-coupled N-channel transistors connecting the output nodes to ground, so the low side of the output is held down instead of being allowed to float. The conductivity types of the transistors may be reversed in another embodiment; the differential amplifier may be N-channel and the remaining transistors (i.e., the transistors used for the logic and latching functions, and the optical isolation function) are then P-channel.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENT

Figure 1:
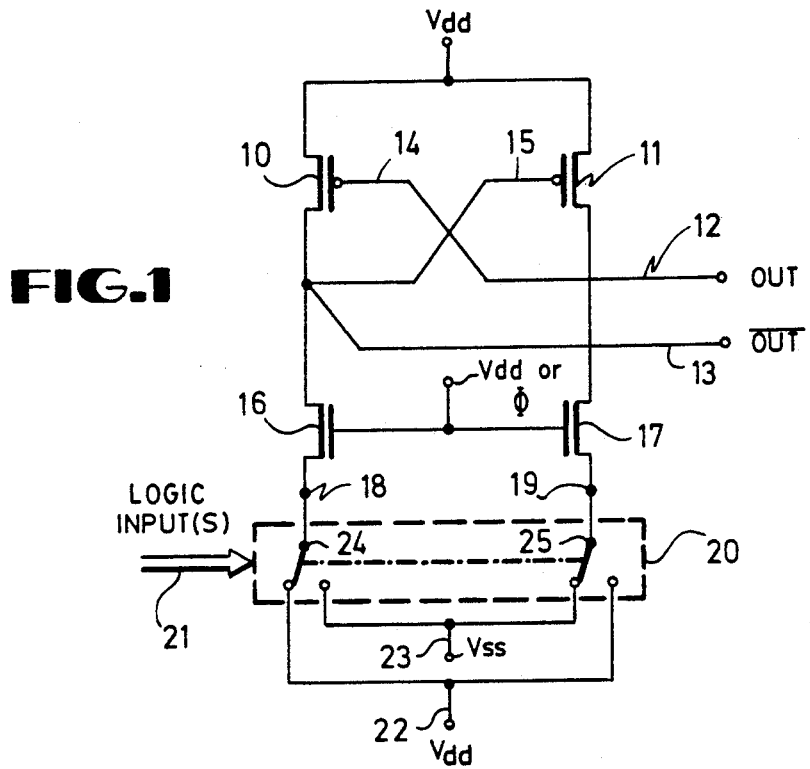
FIG. 1 is an electrical diagram in schematic form of a logic circuit according to one embodiment of the invention.

Referring to FIG. 1, a push-pull cascode logic circuit is illustrated according to one embodiment of the invention. A pair of P-channel transistors 10 and 11 have their drains connected to a relatively positive supply voltage Vdd and have their sources connected to output nodes 12 and 13. The gates 14 and 15 of the transistors 10 and 11 are cross-coupled and connected to the output nodes 12 and 13. The cross-coupled P-channel transistors 10 and 11 form a differential amplifier which senses, amplifies and restores the logic levels of output signals from a logic network. The output nodes 12 and 13 are connected through the source-to-drain paths of a pair of N-channel transistors 16 and 17 (these transistors are optional-the connection may be direct) to a pair of nodes 18 and 19 receiving logic voltages from a combinatorial mapping network 20. This network 20 is made up of N-channel transistors (in the embodiments of FIGS. 1 or 2) and may be any logic combination receiving input(s) 21 and functioning to connect one of the nodes 18 or 19 to the positive Vdd terminal 22 and the other of these input nodes 18 or 19 to ground or Vss terminal 23 of the power supply. The combinatorial logic network 20 is represented by a pair of switches 24 and 25 in FIG. 1. Depending upon the logic input(s) 21, either the node 18 is connected to Vdd and the node 19 to Vss, or vice versa, but no other connection is allowed; i.e., both nodes 18 and 19 cannot be connected to Vdd, nor both to Vss, nor either left in a tristate (high impedance) condition.

The functions of the P-channel transistors 10 and 11 are (1) to decrease the rise time of the output node 12 or 13 which is coupled to Vdd terminal 22 by the network 20 (and through optional transistors 16 and 17), and (2) to pull the signal all the way up to Vdd for the output node 12 or 13 which is coupled to Vdd. The rise time would otherwise be slow because N-channel transistors make poor pull-up devices. Using only N-channel devices, the output node 12 or 13 coupled to Vdd would only be pulled up to Vdd-Vtn, where Vtn if body-effected (i.e., the value of Vtn is influenced by the voltage on the drain of the transistor). Thus the P-channel transistors 10 and 11 pull the signal all the way up to Vdd at a fast rise time, providing restoration of a valid "1" logic level.

The transistors 16 and 17 function to resistively isolate the output nodes 12 and 13 from the capacitance of the nodes 18 and 19; these transistors 16 and 17 are optional and are employed depending upon the capacitive load presented by the logic network. Since the transistors 10 and 11 must supply the charge necessary to pull one of the output nodes 12 or 13 to Vdd from Vdd-Vtn, the addition of the isolating transistors 16 and 17 speeds up the operation of the circuit if the capacitance of the output nodes 12 and 13 is small compared to the capacitance of the nodes 18 and 19 and the capacitance in the logic network 20. The transistors 16 and 17 effectively shield the output nodes 12 and 13 from any large capacitive nodes of the mapping network 20 as these transistors 16 and 17 go from the triode to the cutoff regions. The transistors 16 and 17 have their gates tied to Vdd, so for the output node 12 or 13 coupled to Vss the transistor 16 or 17 will offer very low resistance, but for the output node 12 or 13 coupled to Vdd the transistor 16 or 17 will offer high resistance when the output node passes Vdd-Vtn.

In an alternative embodiment the gates of the N-channel transistors 16 and 17 are connected to a clock voltage so that the combination of the N-channel transistors 16 and 17 with the P-channel transistors 10 and 11 provides a dynamic latch, while still providing the capacitive isolation described above.

Figure 2:
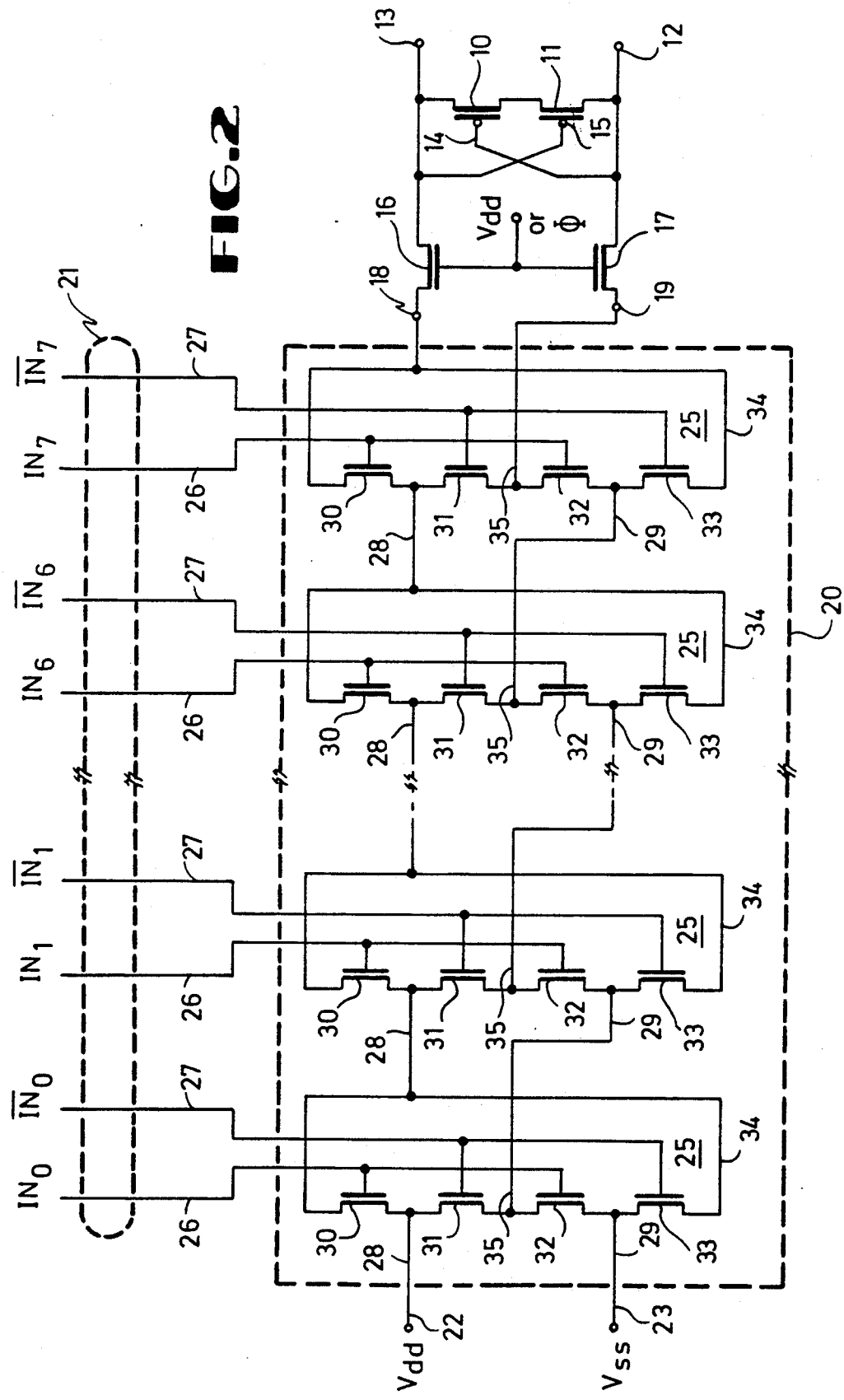
FIG. 2 is an electrical diagram in schematic form of a parity-check logic circuit according to another embodiment of the invention.

Referring to FIG. 2, an embodiment of the invention is illustrated wherein the combinatorial logic network 20 is an eight-bit parity gate used for high-speed parity generation and checking. The input 21 (which was shown in the general case in FIG. 1) in this circuit of FIG. 2 includes eight true-and-complement pairs of input signals $IN_0$ to $IN_7$ (and $\overline{IN_0}$ to $\overline{IN_7}$). A four-transistor combination 25 is associated with each bit position in the chain (each true-and-complement pair of input signals) to generate the XOR and XNOR (i.e., exclusive OR and exclusive NOR) of the respective input signal (e.g., true and complement polarity signals $IN_7$ and $\overline{IN_7}$) on lines 26 and 27 and the signal from the previous stage on lines 28 and 29. The four N-channel transistors 30, 31, 32 and 33 in each one of the combinations 25 have their source-to-drain paths connected between input lines 28 and 29 and output lines 34 and 35, and have their gates connected to the respective input lines 26 and 27 as illustrated. The first stage (receiving inputs $IN_0$ and $\overline{IN_0}$) of course has its inputs 28 and 29 connected to Vdd and Vss instead of to the nodes 34 and 35 of a previous stage. For a given one of the circuits 25, when its input line 26 is high (and its complement input line 27 low), the transistors 30 and 32 are held on and the transistors 31 and 33 held off, so if input line 28 from the previous stage is at Vdd-Vtn (and the other input line 29 is at Vss) then the output 34 is at Vdd-Vtn and output 35 at Vss; or, conversely, if the input line 29 is at Vdd-Vtn (and the other input 28 is at Vss), the output line 34 is at Vss and the output 35 is at Vdd-Vtn. When the input line 26 is low and input 27 is high, then the transistors 31 and 33 are on and transistors 30 and 32 are off, so the line 28 is connected to output line 35 and input line 29 is connected to output line 34. Thus, for each of the circuits 25, the transistors 30 and 33 pass either a Vdd-Vtn or a Vss level to the output node 34, and transistors 31 and 32 pass either Vss or Vdd-Vtn level to node 35 (nodes 34 and 35 are always complementary). The high and low signals propagate along the chain of combinatorial stages 25 from left to right until they reach the nodes 18 and 19. Here, the transistors 16 and 17 may be optionally present to provide isolation between the P-channel differential amplifier made up of the transistors 10 and 11 and the last stage 25 of the mapping network 20, and/or to provide a latching function if a clock Φ is employed at the gates of the transistors 16 and 17.

The circuit of FIG. 2 provides a speed advantage, compared to conventional cascode voltage switch logic, because the voltage at the output node 18 or 19 and associated parts of the mapping network 20 which are rising will start to move higher before the cross-coupled P-channel pullup 10 or 11 comes on; in a conventional circuit the voltage at the falling output node must drop, turning on the pullup on the opposite leg, before the voltage at the rising output node and the associated part of the mapping network may transition high. Second, in the conventional gate all of the positive charge must be supplied by the differential transistors 10 and 11, whereas in the circuit of this invention most of this charge is supplied directly from the Vdd supply coupled through the mapping network 20. In order to speed up the conventional gate, one might increase the size of the P-channel transistors 10 and 11 so as to supply more current. However, since the P-channel transistors 10 and 11 are ratioed against the N-channel transistors of the network, the N-channel transistors must then be increased in size, thereby increasing the capacitance that must be charged. An additional advantage of the circuit of the invention is charge-splitting between the nodes 34 and 35 in the chain during the switching transient of the inputs. This serves to improve the speed performance since some charge is redistributed and need not be supplied from the power supplies.

Figure 3:
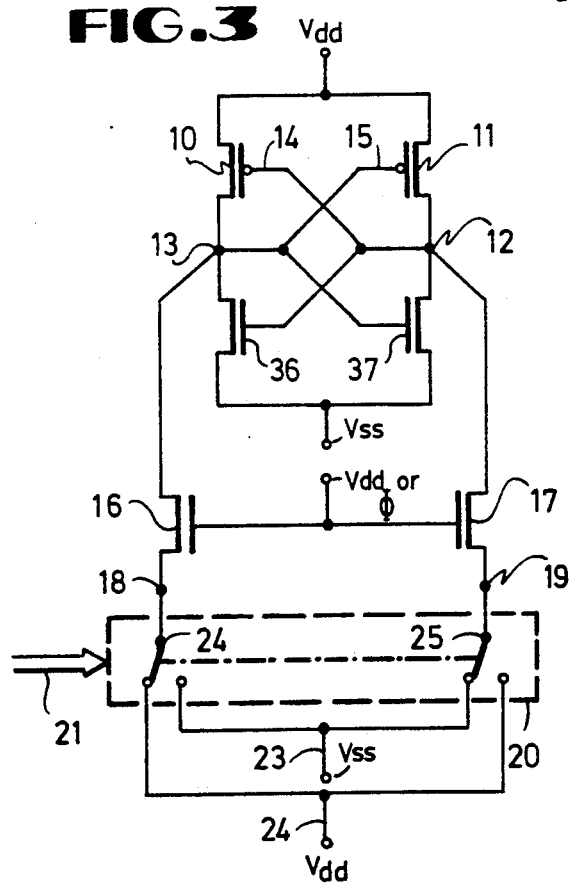
FIG. 3 is an electrical diagram in schematic form of a fully static latch-type logic circuit according to a further embodiment of the invention.

If a clock Φ is used instead of a voltage Vdd at the gates of the transistors 16 and 17 in the circuit in FIGS. 1 or 2 then a latch is provided. The clock signal Φ converts the standard gate into a latch. If only cross-coupled P-channel transistors 10 and 11 were present, the latch is not fully static since the output on node 12 or 13 which is at a logic zero level is floating when the latch is closed. The transistors 16 and 17 with a clock Φ on their gates isolates the transistors 10 and 11 from the input nodes 18 and 19 but not from the output nodes 12 and 13. Thus, as illustrated in FIG. 3, the addition of a pair of cross-coupled N-channel transistors 36 and 37 makes the gate into a fully static latch. The source-to-drain paths of these transistors 36 and 37 are connected separately between the nodes 12 or 13 and Vss, and the gates connected to the opposite nodes 12 or 13, so the node 12 or 13 which is high functions to hold the other node low (instead of floating) by turning on the transistor 36 or 37 for the other node.

Figure 4:
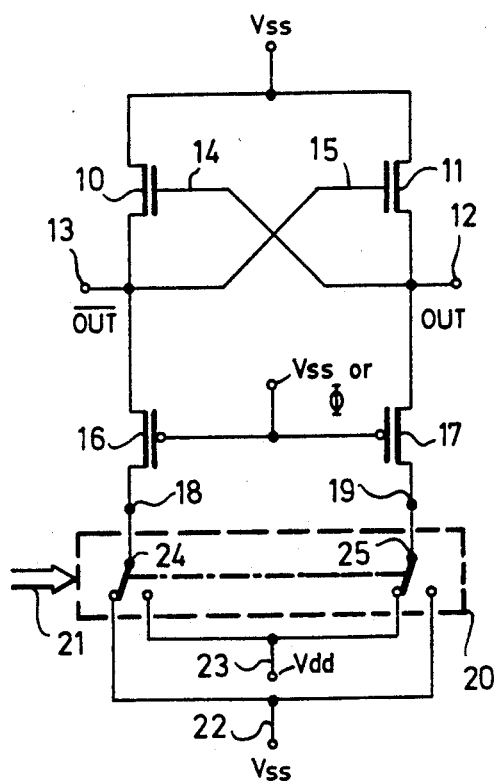
FIG. 4 is an electrical diagram in schematic form of a logic circuit as in FIG. 1 according to another embodiment of the invention employing N-channel instead of P-channel transistors in the differential amplifier and with the remaining N-channel transistors replaced with P-channel transistors.

Although shown in FIGS. 1-3 as employing P-channel pull-up transistors 10 and 11 along with N-channel logic and latching transistors, the transistor types may be reversed as seen in the circuit of FIG. 4. N-channel transistors 10 and 11 are used in the differential amplifier (in this case as pull-down transistors), along with P-channel logic and latching transistors such as the transistors 16 and 17 and the transistors which make up the combinatorial network 20; in FIG. 4 the Vdd and Vss supply points of are reversed compared to FIGS. 1-3.

The logic family provided by this invention results in a significant speed advantage compared to conventional cascode voltage switch logic, and, for a given speed requirement, provides an area advantage. The logic form of the invention also provides both speed and and area advantages over conventional static CMOS logic for a class of circuits whose performance has limited range.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore comtemplated that the appended claims will cover any such modifications or embodiments as fall within the true scope of the invention.

What is claimed is:

1. A logic circuit using a voltage supply having first and second terminals, comprising:
   (a) first transistor having a source-to-drain path and a gate, one end of said source-to-drain path of said first transistor being coupled to said first terminal of said voltage supply, the other end of said source-to-drain path of said first transistor being coupled to a first output node; a second transistor having a source-to-drain path and a gate, one end of said source-to-drain path of said second transistor being coupled to said first terminal of said voltage supply, the other end of said source-to-drain path of said second transistor being coupled to a second output node; said gates of said first and second transistors being cross-coupled to said first and second output nodes;
   (b) a combinatorial logic network having switching means coupling one of said first and second output nodes to said first terminal of said voltage supply and other of said first and second output nodes to said second terminal of said voltage supply, or vice versa, depending upon the value of a logic input of said network, to thereby drive said first and second output nodes toward voltage levels of said first and second terminals.

2. A circuit according to claim 1 wherein said first and second transistors are P-channel MOS transistors, and said one terminal of said voltage supply is relatively positive.

3. A circuit according to claim 2 wherein said logic network is made up of N-channel MOS transistors.

4. A circuit according to claim 1 wherein said first and second transistors are N-channel MOS transistors, and said one terminal of said voltage supply is relatively negative.

5. A circuit according to claim 4 wherein said logic network is made up of P-channel MOS transistors.

6. A circuit according to claim 1 including third and fourth transistors each having a source-to-drain path separately coupled in series between one of said output nodes and said logic network.

7. A circuit according to claim 6 wherein said third and fourth transistors are of a conductivity type opposite that of said first and second transistors.

8. A circuit according to claim 7 wherein said third and fourth transistors each have a gate coupled to said one terminal of said supply.

9. A circuit according to claim 7 wherein said third and fourth transistors each have a gate coupled to a clock voltage source to provide a dynamic latch for said output nodes.

10. A circuit according to claim 1 including third and fourth tansistors each having a source-to-drain path separately coupled in series between one of said output nodes and said other terminal of said voltage supply, said third and fourth transistors each having a gate cross-coupled to one of said output nodes.

11. A circuit according to claim 10 wherein said third and fourth transistors are of a conductivity type opposite that of said first and second transistors.

12. A logic circuit employing a voltage supply having relatively positive and relatively negative terminals, said circuit comprising:
   (a) a first P-channel MOS transistor having a source-to-drain path and a gate, one end of said source-to-drain path of said first transistor being coupled to said relatively positive terminal of said voltage supply, the other end of said source-to-drain path of said first transistor being coupled to a first output node; a second P-channel MOS transistor having a source-to-drain path and a gate, one end of said source-to-drain path of said second transistor being coupled to said relatively positive terminal of said voltage supply, the other end of said source-to-drain path of said second transistor being coupled to a second output node; said gates of said first and second transistors being cross-coupled to said first and second output nodes; and
   (b) a switching circuit including N-channel MOS transistors coupling one of said output nodes of said relatively positive terminal of said voltage supply and the other of said output nodes to said relatively negative terminal of said voltage supply, or vice versa, depending upon the value of a logic input to said switching circuit.

13. A circuit according to claim 12 including third and fourth N-channel MOS transistors each having a source-to-drain path separately coupled in series between the one of said output nodes and said switching circuit.

14. A circuit according to claim 13 wherein said third and fourth transistors each have a gate coupled to said relatively positive terminal of said voltage supply.

15. A circuit according to claim 13 wherein said third and fourth transistors each have a gate coupled to a clock voltage supply to provide a dynamic latch for said output nodes.

16. A circuit according to claim 12 including third and fourth N-channel transistors each having a source-to-drain path separately coupled in series between one of said output nodes and said relatively negative terminal of said voltage supply, said third and fourth transistors each having a gate cross-coupled to one of said output nodes.

17. A logic circuit comprising:
   (a) first and second P-channel MOS transistors each having a source-to-drain path and a gate, one end of each of said source-to-drain paths being coupled to a relatively positive voltage supply, the other ends of said source-to-drain paths being separately coupled to first and second output nodes, said gates being cross-coupled to said first and second output nodes; and
   (b) a switching circuit including N-channel MOS transistors coupling one of said output nodes to said relatively positive voltage supply and the other of said output nodes to a relatively negative voltage supply, or vice versa, depending upon the value of a logic input to said switching circuit
   (c) wherein said switching circuit includes third, fourth, fifth and sixth N-channel transistors having source-to-drain paths coupled in order in a series circuit, means coupling a juncture of the third and fourth transistors to said relatively positive voltage supply, means coupling a juncture of the fifth and sixth transistors to said relatively negative voltage supply, means coupling a juncture of the third and sixth transistors to said first output node, means coupling a juncture of the fourth and fifth transistors to said second output node, said logic input being coupled to gates of said third and fifth transistors and the complement of said logic input to gates of said fourth and sixth transistors.

18. A circuit according to claim 17 including a plurality of sets of said third, fourth, fifth and sixth transistors, wherein each set has a different logic input and complement of said logic input coupler thereto.

* * * * *

UNITED STATES PATENT AND TRADEMARK OFFICE
CERTIFICATE OF CORRECTION

PATENT NO. : 5,023,480

DATED : June 11, 1991

INVENTOR(S) : GIESEKE et al.

It is certified that error appears in the above-identified patent and that said Letters Patent is hereby corrected as shown below:

```
Column 1, line 9, change "2" to --22--;
         line 27, change "two-up" to --two pull-up--.
Column 4, line 68, delete "and" (second occurrence).
```

Signed and Sealed this

Fifteenth Day of December, 1992

Attest:

DOUGLAS B. COMER

*Attesting Officer*   *Acting Commissioner of Patents and Trademarks*